United States Patent [19]

Hallford

[11] 4,392,251

[45] Jul. 5, 1983

[54] SYMMETRIC MICROWAVE MIXER WITH COPLANAR DIODE CONNECTION

[75] Inventor: Ben R. Hallford, Wylie, Tex.

[73] Assignee: Rockwell International Corporation, El Segundo, Calif.

[21] Appl. No.: 286,412

[22] Filed: Jul. 24, 1981

[51] Int. Cl.³ .......................... H04B 1/26; H03H 7/42
[52] U.S. Cl. .................................... 455/327; 333/26; 455/330
[58] Field of Search ............................ 455/325–327, 455/330, 331; 333/26

[56] References Cited

U.S. PATENT DOCUMENTS

| | | |
|---|---|---|
| 2,834,876 | 5/1958 | Pritchard et al. |
| 3,652,941 | 3/1972 | Neuf |
| 3,678,433 | 7/1972 | Hallford |
| 3,681,697 | 8/1972 | Moroney |
| 3,831,097 | 8/1974 | Neuf |
| 4,186,352 | 1/1980 | Hallford ............................ 455/330 |
| 4,240,052 | 12/1980 | Hallford |

OTHER PUBLICATIONS

George L. Matthaei, et al., "Microwave Filters, Impedance-Matching Networks, and Coupling Structures", McGraw-Hill, New York, 1964, pp. 809–812.
Julius Lange, "Interdigitated Strip-Line Quadrature Hybrid", 1969 *International Microwave Symposium*, Dallas, Texas, May 5–7, IEEE Cat. No. 69 c 6, pp. 10–13.
Ben R. Hallford, "Trace Phase States to Check Mixer Designs", *Microwaves*, Jun. 1980, pp. 52–60.

*Primary Examiner*—Marc E. Bookbinder
*Attorney, Agent, or Firm*—Michael E. Taken; Bruce C. Lutz; Howard R. Greenberg

[57] ABSTRACT

Microwave circuit layout structure is disclosed for a diode mixer frequency converter. The circuit layout structure is compact and symmetric, and enables coplanar diode lead connection.

24 Claims, 3 Drawing Figures

SYMMETRIC MICROWAVE MIXER WITH COPLANAR DIODE CONNECTION

TECHNICAL FIELD

The invention relates to microwave diode mixers and associated circuitry for up and down conversion between high frequency signals (e.g., RF or LO in the 6 GHz range) and low frequency signals (e.g, IF in the 70 MHz range), and more particularly to the circuit layout structure supplying the ports for a diode mixer.

BACKGROUND AND SUMMARY

The present invention evolved from continuing development efforts pertaining to subject matter disclosed in my co-pending Application Ser. No. 265,128, filed May 19, 1981, entitled "Symmetric Microwave Mixer". This co-pending Application discloses a diode mixer with compact, symmetric conductor port structure significantly reducing unwanted sensitivity to adverse perameters. One of the features afforded by the substrate circuit layout is the keyed alignment mounting of the diode quad in a singular precise position positively locking the quad in place. This singular registry is facilitated by two of the leads from the diode quad extending through the substrate.

The present invention relates to improvements in the microstrip circuit layout and structure in those applications where coplanar diode connection is desired. Such applications arise where other factors, e.g., cost, outweigh the type of mounting above described.

In a particularly desirable aspect of the present invention, coplanar diode mounting is achieved without sacrificing compactness or symmetry of the mixer port structure. The mixer port structure of the present invention significantly reduces unwanted sensitivity to adverse parameters, and also overcomes problems of distortion caused by unequal conduction paths and diode lead lengths. Transmission lengths along the conductors leading to the diode quad mixer are minimized, to reduce loss and exposure to mismatch influences. Transmission path lengths through the diodes of the mixer quad are also minimized, and are substantially equal, to thus eliminate unwanted phase shift due to differential path lengths through the mixer diodes. The diode mixer leads are short and orthogonal, to provide good impedance matching and minimize unwanted coupling.

In a further desirable aspect of the invention, a single mixer of the diode quad type is provided and affords microwave frequency conversion with desirable microstrip transmission characteristics, as opposed to various undesirable slotline or coplanar waveguide transmission characteristics and the like and their attendant constraints. Image frequency signals generates in the two diode pairs circulate in the diode quad only, to return the image frequency power to the diodes to reduce conversion loss. There is mutual isolation between RF, LO and IF signals over a broad frequency range. The circuit accepts transposed RF and LO inputs.

The operating bandwidth of the mixer is significantly increased by the use of the balanced port structure of the invention, the equalized conduction path lengths, the short lead lengths, and single point connections between the diode pairs facilitating "zero lead length" between the diode connection points.

In another desirable aspect of the invention, standard printed circuit board techniques may be used for fabrication, resulting in significant cost reduction. The invention also enables the use of low dielectric constant substrate material, further reducing cost.

In a further aspect of the invention, microstrip circuit layout and structure is provided in double sideband applications affording coplanar mounting of a diode pair.

DETAILED DESCRIPTION

Figure 1:
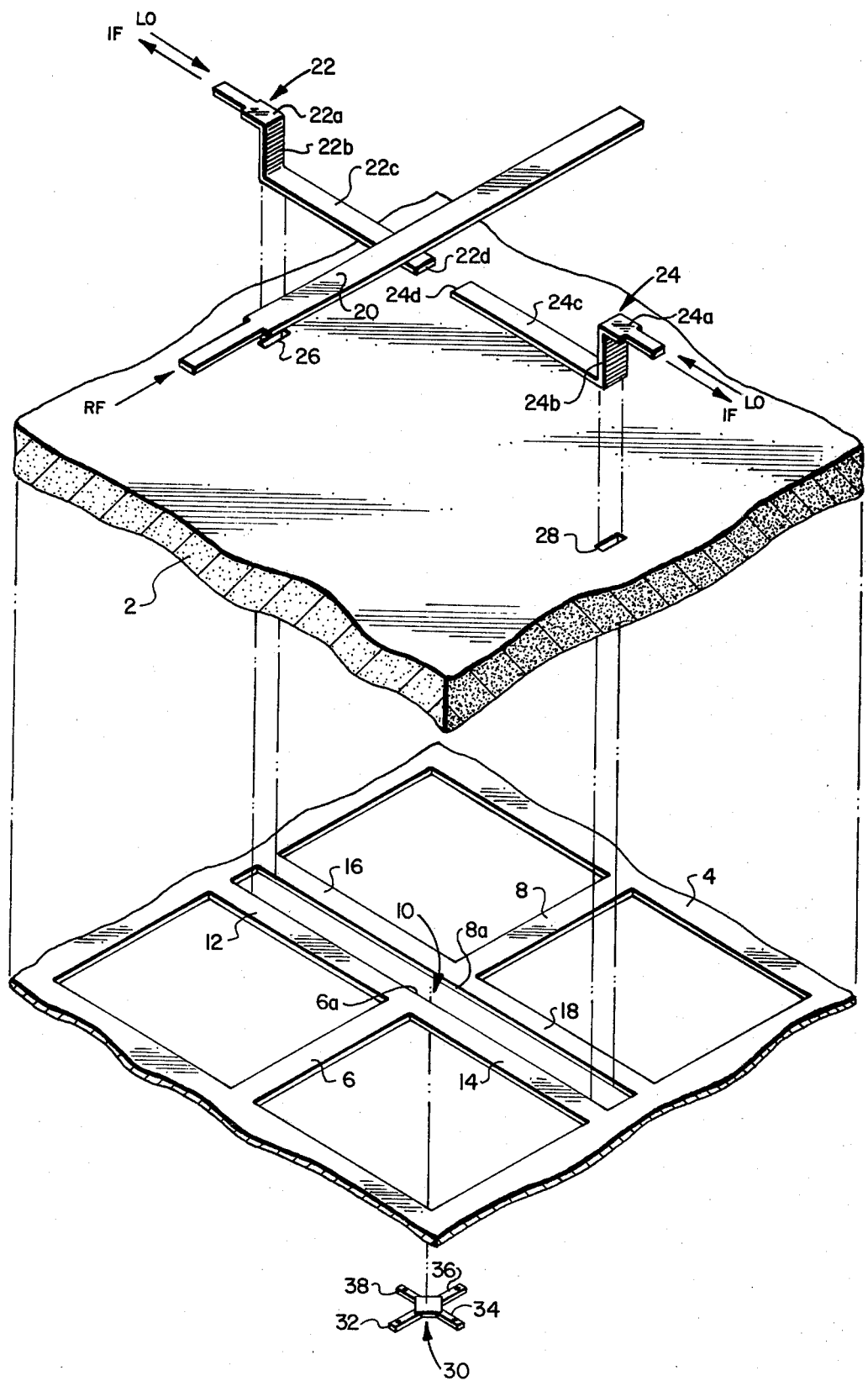
FIG. 1 is an exploded isometric view of microstrip circuit layout and structure constructed in accordance with the invention supplying the ports for a diode quad mixer.
Figure 2:
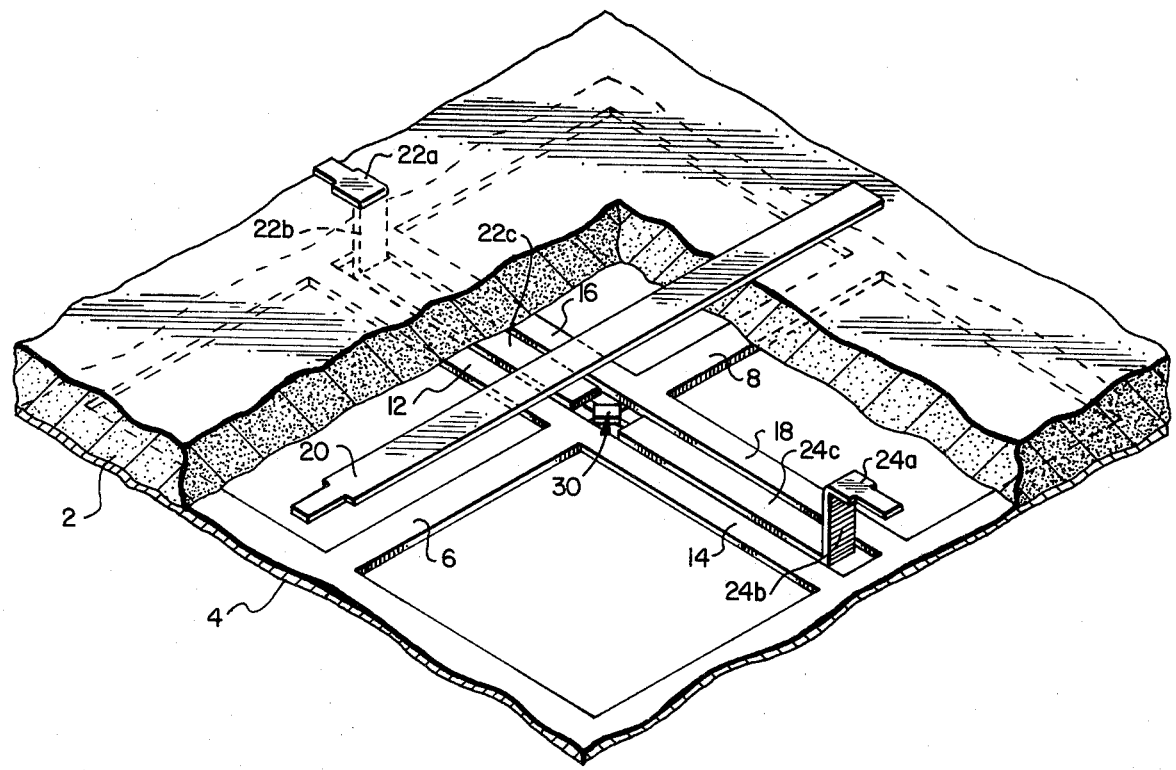
FIG. 2 is an assembly isometric view of the circuit layout and structure of FIG. 1.

FIGS. 1 and 2 show microstrip circuit layout structure constructed in accordance with the invention for a microwave mixer frequency converter. A planar dielectric substrate 2 has a ground plane 4 on the bottomside thereof. First and second conductors 6 and 8 extend from the ground plane towards each other to a separation gap 10 therebetween. Each conductor 6 and 8 has oppositely collinearly divergent stubs 12 and 14, and 16 and 18, respectively, extending to ground plane 4. An RF transmission line 20 is on the topside of substrate 2 juxtaposed the first and second conductors 6 and 8 for interacting therewith to balun couple a field balanced between conductors 6 and 8 across gap 10.

Third and fourth conductors 22 and 24 have topside coplanar sections 22a and 24a on the topside of substrate 2 and have respective linking sections 22b and 24b, such as bus wire links or the like, extending down through substrate 2 to respective bottomside coplanar sections 22c and 24c. Linking sections 22b and 24b extend down through apertures 26 and 28 in the substrate. Bottomside sections 22c and 24c have spaced facing ends 22d and 24d proximate the facing ends 6a and 8a of the first and second conductors and extend oppositely away therefrom. Bottomside section 22c of the third conductor 22 extends in spaced parallel relation between and coplanar with the first stubs 12 and 16 of said pairs. Bottomside section 24c of the fourth conductor 24 extends in spaced parallel relation between and coplanar with the second stubs 14 and 18 of said pairs. Bottomside conductor sections 22c and 24c are separated by the same gap 10 which separates first and second conductors 6 and 8.

Bottomside sections 22c and 24c of the third and fourth conductors 22 and 24 are collinear and extend orthogonally to collinear first and second conductors 6 and 8. Transmission line 20 on the topside of substrate 2 is parallel to the first and second conductors 6 and 8, and orthogonal to and coplanar with topside sections 22a and 24a of the third and fourth conductors 22 and 24.

Figure 3:
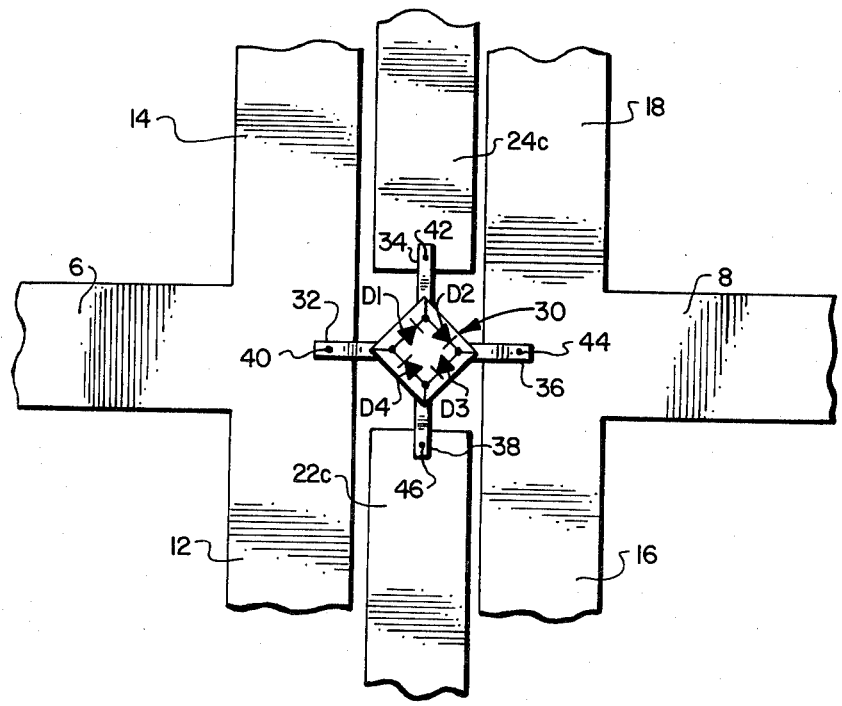
FIG. 3 is an enlarged view from below of the central portion of FIG. 2, showing the diode quad connection.

A diode quad mixer 30 interconnects first, second, third and fourth conductors 6, 8, 22 and 24, respectively, at coplanar connection points on the bottomside of substrate 2, FIG. 3, for heterodyne modulation product signal generation. Diode quad mixer 30 has four coplanar leads 32, 34, 36 and 38 connected to respective conductors 6, 24c, 8 and 22c at a single point on each, as shown at respective coplanar connection points 40, 42, 44 and 46. Diode mixer leads 32, 34, 36 and 38 are orthogonal to each other and of substantially the same length.

When implemented as a down converter, an RF signal is input at port 20, and quadrature LO signals are input at ports 22 and 24. The RF signal is coupled from transmission line 20 acting as a primary to secondary conductors 6 and 8, which in turn provide the field existing across gap 10 between balanced first and second conductors 6 and 8. Conductors 6 and 8 thus provide a balanced input port to diode quad mixer 30 at points 40 and 44, FIG. 3. The LO signals from the input ports provided by third and fourth conductors 22 and 24 are provided to the diode quad mixer at points 46 and 42.

Diode quad mixer 30 receives the RF and LO signals and outputs a plurality of frequencies, including an IF signal at a frequency which is the difference between the RF and LO signal frequencies. The frequencies which are output from mixer 30 are the modulation products which exist according to the heterodyne principle by which the mixer operates, as known in the art, wherein an RF signal and an LO signal are applied to a nonlinear element, such as a diode. The RF and LO signals are mixed in the diode quad 30 to generate the various modulated frequencies, including IF signals on conductors 22 and 24, with conductors 6 and 8, 12, 14, 16, and 18 being the IF signal returns. These IF signals may be passed through IF bandpass filters, for example as described in my U.S. Pat. No. 3,678,433, issued July 18, 1972, entitled "RF Rejection Filter". The outputs of such filters may, for example, be connected to a 90° quadrature 3dB coupler, for example as shown in U.S. Pat. No. 3,831,097 to Neuf. The LO signals supplied to conductors 22 and 24 may be passed through IF rejection capacitors or filters, i.e., LO bandpass filters, such as shown in my U.S. Pat. No. 4,240,052, issued Dec. 16, 1980, entitled "Balun Filter Apparatus". These signals may also be passed through a branchline coupler, such as described in "Microwave Filters, Impedance-Matching Networks, and Coupling Structures", George L. Matthaei, et al., McGraw-Hill, New York, 1964, pp. 809-812, or through an interdigitated strip Lange-type coupler, for example as described in "Interdigitated Strip-Line Quadrature Hybrid", Julius Lange, 1969 International Microwave Symposium, Dallas, Tex., May 5-7, IEEE Cat. No. 69 c 6, pp. 10-13.

When implemented as an up converter, LO and IF signals are each input at ports 22 and 24 to generate an output RF signal at port 20. In this latter implementation, the RF signal is induced on transmission line 20 from first and second conductors 6 and 8 acting as primaries. In other applications, for both up and down converters, the RF and LO signals are transposed.

As is known in the art, a down converter mixer generates a signal which is the image of the RF signal but on the opposite frequency side of the LO signal. For instance, a mixer receiving a 6 GHz (6,000 MHz) input RF signal and a 5,930 MHz input LO signal would generate a 70 MHz IF signal and a 5,860 MHz image RF signal. Typically about half of the incoming RF power is used in generating this image frequency signal. The loss in converting an incoming RF signal to an IF signal is thus significantly increased by this image frequency generation. Likewise for up conversion, conversion loss is caused by frequency generation of an unused sideband. For further background regarding mixer operation, reference is made to my article entitled "Trace Phase States to Check Mixer Designs", *Microwaves*, June, 1980, pp. 52-60.

Prior devices have eliminated the image frequency signal in a variety of ways. Some devices use filters to prevent the image frequency signal from entering the input signal circuitry, but this still results in an energy loss to the system, and also reduced bandwidth. Some devices provide an open or short circuit at the diodes in order to recover, or reduce the loss of, the image frequency energy. U.S. Pat. Nos. 2,834,876 and 3,681,697 show image recovery mixers where the image frequency power is reflected back to the mixer to provide recovery of the image frequency energy. Another technique is the use of a diode quad bridge, for example U.S. Pat. Nos. 3,831,097 and 3,652,941 to Neuf, for cancelling the image frequency within the mixer by circulating the image current in the diode quad only. This returns the image frequency power to the diodes, thus reducing conversion loss.

Reduction of conversion loss in the mixer bridge is degraded by various influences introducing distortion and unwanted phase shift, causing other than a precise 180° phase differential between the two diode pairs for the generated image frequency. Some of these degrading influences include long lead lengths from the mixer bridge (inducing stray compacitance), unequal lead lengths, and undesired coupling between the leads caused by nonorthogonal orientation therebetween. The present invention offers significant improvements substantially overcoming these degrading influences.

Referring to FIGS. 1 and 3, the lengths of the diode quad connection leads 32, 34, 36 and 38 are extremely short, and have substantially the same length. These leads are coplanar and are oriented orthogonally with respect to each other as they extend outwardly from the quad. This symmetric structure affords substantially equal path lengths through the diodes. For example, the path length from connection point 40 through diode D1 to connection point 42 is substantially equal to the path length from connection point 42 through diode D2 to connection point 44, which in turn is substantially equal to the path length from connection point 44 through dide D3 to connection point 46, which in turn is substantially equal to the path length from connection point 46 through diode D4 to connection point 40.

The symmetric structure of the invention and the substantially equal path lengths through the diodes provide precise 180° phase differential between the diode pairs for generated image frequency, and a net image voltage of zero, thus reducing conversion loss. Unequal path lengths would cause a finite traversal distance for the image current on one or more of the conductors and this would cause a phase shift such that the image frequency phase in diode pair D1 and D2, for example, would be other than 180° out of phase with the image frequency phase in diode pair D3 and D4. This would reduce the conversion efficiency because of uncancelled image frequency power.

The structure of the invention also enables single connection points on each of the conductors for the diode quad mixer. RF conductor point 40 provides a single common connection point for diodes D4 and D1. LO conductor point 42 provides a single common connection point for diodes D1 and D2. RF conductor point 44 provides a single common connection point for diodes D2 and D3. LO conductor point 46 provides a single common connection point for diodes D3 and D4. These common connection points for the respective diodes further provide precise 180° phase differential between the diode pairs for generated image frequency, and a net image voltage of zero, thus reducing conversion loss. In the absence of these single point connections between the diode pairs, there would be a finite traversal distance for the image current on one or more of the conductors and this would cause a phase shift such that the image frequency phase in one diode pair would be other than 180° out of phase with the image frequency phase in the other diode pair.

In a desirable aspect of the invention, the circuit layout structure is fabricated using standard printed circuit board techniques. A simple off-the-shelf dielectric substrate, which is copper clad on both sides, is used. The copper is merely etched away to yield the conductor patterns shown.

In another advantageous aspect of the invention, the circuit layout and structure provides desirable microstrip transmission characteristics, as opposed to slotline and the like transmission characteristics and their attendant constraints. These constraints include various limitations on the dimensions of the slot, minimum ground plane spacing on either side of the slot, requisite high dielectric constant substrate, transmission mode waveguide problems, etc.

The present invention is implementable on substrate material of low dielectric constant, for example in the range 2 to 5. While a high dielectric constant substrate may of course be used, the use of low dielectric constant substrate is preferred in order to reduce cost.

The preferred dimensions of the conductor widths and gap widths are easily and cost efficiently implementable with standard printed circuit board techniques. For a typical 6 GHz mixer, the width of gap 10 is 72 mils. The width of each of bottomside conductor sections 22c and 24c, and of each of the stubs 12, 14, 16 and 18, is 60 mils. The width of the separation gap between conductor ends 22d and 24d is 72 mils. The width of each of the first and second conductors 6 and 8 is 60 mils. The width of transmission line 20 at its wide section is 60 mils. The combined length of stubs 12 and 14 is 685 mils. The combined length of conductors 6 and 8 and gap 10 is also 685 mils. The substrate has a dielectric constant of 2.17 and a thickness of 15 mils.

The present invention affords relatively large dimensions which are easy to implement and cost efficient in manufacture. The invention further eliminates the need for a pair of balanced conductor extension sections between respective conductors 6 and 8 and the location of the mixer bridge, wherein the extension sections have the transmission line induced field therebetween and supply a balanced port to the mixer.

The circuit layout provides mutual isolation between the RF, LO and IF signals. Referring to FIG. 3, the LO signal on bottomside conductor 42c is isolated from bottomside conductor 22c because of the effective ground provided by points 40 and 44. One LO signal path from point 42 of conductor 24 to point 46 of conductor 22 is through diodes D2 and D3. However, the junction point between diodes D2 and D3 is the effective ground point 44 relative to LO signals, and hence the LO signal may flow from conductor point 42 through diode D2 but is isolated from conductor point 46. Point 44 appears to be an effective ground or a return relative to LO signals because of its pair of stubs 16 and 18. The other LO signal path from conductor point 42 to conductor point 46 is through diodes D1 and D4, but the junction point 40 therebetween is an effective ground point or return due to stubs 12 and 14. LO signals from point 46 are likewise isolated from point 42. For applications requiring even greater isolation, the ring quad 30 of FIG. 3 may be replaced by a bridge quad wherein the polarities of diodes D3 and D4 are reversed.

The RF signal on balanced junction points 40 and 44 due to the induced RF field between conductors 6 and 8 across gap 10 is isolated from conductors 22 and 24. The RF signal from junction point 40 flows through diode D1 and then diode D2 to junction point 44. Since RF conductor points 40 and 44 are balanced, they are each other's reference points, and hence the voltage on junction point 40 is referenced to junction point 44, not to ground. The RF signal from junction point 40 flows through diode D1 toward point 42 and then away from point 42 through diode D2. Conductor point 42 thus sees opposite polarities (voltages which are 180° out of phase), and hence no new or additional net voltage is induced on conductor point 42 from the RF signal between conductor points 40 and 44. The RF signal between junction points 40 and 44 is likewise isolated from conductor 22 and point 46.

The LO signals on conductors 22 and 24 are isolated from the RF signal between points 40 and 44. The LO signal on point 42 sees an effective ground at each of points 40 and 44, due to the return stubs whereby to add the same effective voltage to each in parallel, resulting in no change of the net voltage difference between points 40 and 44. The LO signal on conductor 24c sees equal reference levels at points 40 and 44 due to stubs 14 and 18 between which bottomside conductor section 24c extends in closely spaced parallel coplanar relation. The LO signal on point 46 is likewise isolated from the RF signals between points 40 and 44.

In an alternative diode arrangement for even higher isolation, the polarity of diodes D1 and D2 is reversed.

In an alternative embodiment, diodes D3 and D4, lead 38, conductor 22, and stubs 12 and 16 are eliminated. This provides a double sideband version affording coplanar connection of diode pair D1 and D2.

It is recognized that various modifications are possible within the scope of the appended claims.

I claim:

1. Balun coupled microwave circuit layout and structure comprising:

a dielectric substrate;

ground plane means on the bottomside of said substrate;

first and second conductors on the bottomside of said substrate collinearly extending from said ground plane means towards each other and terminating in respective spaced ends in a separation gap therebetween;

a transmission line on the topside of said substrate juxtaposed said first and second conductors for interacting therewith to balun couple a field balanced between said first and second conductors across said gap;

third and fourth conductors having topside coplanar sections on the topside of said substrate and having respective linking sections extending down through said substrate to respective bottomside coplanar sections on the bottomside of said substrate, said bottomside sections having ends spaced from and facing each other proximate the spaced ends of said first and second conductors and extending oppositely away therefrom; and a diode quad mixer connected to said first and second conductors and said respective bottomside coplanar sections at coplanar connection points on the bottomside of said substrate for heterodyne modulation product signal generation.

2. The invention according to claim 1 wherein said diode quad mixer has four coplanar leads connected to respective said first and second conductors and said bottomside coplanar sections at a single point on each.

3. The invention according to claim 2 wherein adjacent ones of said diode mixer leads are orthogonal to each other and all of said diode mixer leads are of substantially the same length.

4. The invention according to claim 1 wherein said bottomside sections of said third and fourth conductors are collinear and extend orthogonally to said first and second conductors and face each other at said separation gap.

5. The invention according to claim 4 wherein said transmission line on the topside of said substrate is parallel to said first and second conductors, and orthogonal to and coplanar with said topside sections of said third and fourth conductors.

6. Balun coupled microwave mixer circuit layout and structure comprising:

a dielectric substrate;

ground plane means on the bottomside of said substrate;

first and second conductors on the bottomside of said substrate extending from said ground plane means towards each other and terminating in respective first spaced ends at a separation gap therebetween;

a transmission line on the topside of said substrate juxtaposed and parallel to said first and second conductors for interacting therewith to balun couple a field balanced between said first and second conductors across said gap;

third and fourth conductors having topside coplanar sections on the topside of said substrate collinearly extending towards each other, and having respective linking sections extending down through said substrate to respective bottomside coplanar sections on the bottomside of said substrate collinearly extending towards each other and terminating in respective second spaced ends separated by said gap, said third and fourth conductors extending orthogonally to said transmission line and said first and second conductors; and a diode quad mixer on the bottomside of said substrate interconnecting said conductors at coplanar connection points on the bottomside of said substrate for heterodyne modulation product signal generation, said diode mixer mounted by a first pair of opposite leads connected coplanarly to said first and second conductors and by a second pair of opposite leads connected coplanarly to said bottomside sections of said third and fourth conductors.

7. The invention according to claim 6 further comprising means setting the connection points on said first and second conductors at substantially the same potential reference level relative to signals on said third and fourth conductors such that no net potential is induced between said first and second conductors from either of said third and fourth conductors such that signals on said third and fourth conductors are isolated from said first and second conductors.

8. The invention according to claim 7 wherein said setting means further provides at each said first and second conductor connection points a low impedance effective ground or return relative to signals on said third and fourth connectors such that signals on said third conductor are isolated from said fourth conductor, and signals on said fourth conductor are isolated from signals on said third conductor.

9. The invention according to claim 8 wherein said setting means comprises stub means extending from said first and second conductors to said ground plane means.

10. The invention according to claim 9 wherein each of said first and second conductors has a pair of stubs diverging therefrom to said ground plane means.

11. The invention according to claim 10 wherein said bottomside section of said third conductor extends in spaced parallel relation between first stubs of said pairs, and wherein said bottomside section of said fourth conductor extends in spaced parallel relation between second stubs of said pairs.

12. Balun coupled microwave mixer circuit layout and structure comprising:

a dielectric substrate;

ground plane means on the bottomside of said substrate;

first and second conductors on the bottomside of said substrate extending from said ground plane means towards each other and terminating in respective first spaced ends at a separation gap therebetween, each conductor additionally having oppositely collinearly diverging stubs extending to said ground plane means;

a transmission line on the topside of said substrate juxtaposed said first and second conductors for interacting therewith to balun couple a field balanced between said first and second conductors across said gap;

third and fourth conductors having topside collinear sections coplanar with and orthogonal to said transmission line and having respective linking sections extending down through said substrate to respective bottomside collinear sections coplanar with and orthogonal to said first and second conductors and terminating in respective second spaced ends separated by said first mentioned gap, said bottomside section of said third conductor extending in spaced parallel relation between first stubs of said pairs, said bottomside section of said fourth conductor extending in spaced parallel relation between second stubs of said pairs; and a diode quad mixer connected to said first and second conductors and said respective bottomside coplanar sections at coplanar connection points on the bottomside of said substrate for heterodyne modulation product signal generation.

13. Balun coupled microwave circuit layout and structure comprising:

a dielectric substrate;

ground plane means on the bottomside of said substrate;

first and second conductors on the bottomside of said substrate collinearly extending from said ground plane means towards each other and terminating in respective spaced ends to a separation gap therebetween;

a transmission line on the topside of said substrate juxtaposed said first and second conductors for interacting therewith to balun couple to field balanced between said first and second conductors across said gap;

a third conductor having a topside section on the topside of said substrate and having a linking section extending down through said substrate to a bottomside section on the bottomside of said substrate, said bottomside section having a facing end proximate the facing ends of said first and second conductors; and a diode pair mixer connected to said first and second conductors and said bottomside section at coplanar connection points on the bottomside of said substrate for heterodyne modulation product signal generation.

14. The invention according to claim 13 wherein said diode pair mixer has three coplanar leads connected to respective said first and second conductors at a single point on each.

15. The invention according to claim 14 wherein adjacent ones of said diode pair mixer leads are orthogonal to each other and all of said diode mixer leads are of substantially the same length.

16. The invention according to claim 13 wherein said bottomside section of said third conductor extends orthogonally to said first and second conductors.

17. The invention according to claim 16 wherein said transmission line on the topside of said substrate is parallel to said first and second conductors, and orthogonal to and coplanar with said topside section of said third conductor.

18. Balun coupled microwave mixer circuit layout and structure comprising:
a dielectric substrate;
ground plane means on the bottomside of said substrate;
first and second conductors on the bottomside of said substrate collinearly extending from said ground plane means towards each other and terminating in respective spaced ends at a separation gap therebetween;
a transmission line on the topside of said substrate juxtaposed and parallel to said first and second conductors for interacting therewith to balun couple a field balanced between said first and second conductors across said gap;
a third conductor having a topside section on the topside of said substrate and having a linking section extending down through said substrate to a bottomside section on the bottomside of said substrate extending toward and terminating proximate said gap, said third conductor extending orthogonally to said transmission line and said first and second conductors; and
a diode pair mixer on the bottomside of said substrate interconnecting said conductors at coplanar connection points on the bottomside of said substrate for heterodyne modulation product signal generation, said diode pair mixer mounted by a first pair of opposite leads connected coplanarly to said first and second conductors and by a third lead connected coplanarly to said bottomside section of said third conductor.

19. The invention according to claim 18 further comprising means setting the connection points on said first and second conductors at substantially the same potential reference level relative to signals on said third conductor such that no net potential is induced between said first and second conductors from said third conductor such that signals on said third conductor are isolated from said first and second conductors.

20. The invention according to claim 19 wherein said setting means further provides at each said first and second conductor connection points a low impedance effective ground or return relative to signals on said third conductor.

21. The invention according to claim 20 wherein said setting means comprises stub means extending from said first and second conductors to said ground plane means.

22. The invention according to claim 21 wherein each of said first and second conductors has a stub diverging therefrom to said ground plane means.

23. The invention according to claim 22 wherein said bottomside section of said third conductor extends in spaced parallel relation between said stubs.

24. Balun coupled microwave mixer circuit layout and structure comprising:
a dielectric substrate;
ground plane means on the bottomside of said substrate;
first and second conductors on the bottomside of said substrate extending from said ground plane means towards each other and terminating in respective spaced ends at a separation gap therebetween, each conductor having a stub diverging therefrom to said ground plane means, said stubs extending in spaced parallel relation;
a transmission line on the topside of said substrate juxtaposed said first and second conductors for interacting therewith to balun couple a field balanced between said first and second conductors across said gap;
a third conductor having a topside section on the topside of said substrate coplanar with and orthogonal to said transmission line and having a linking section extending down through said substrate to a bottomside section on the bottomside of said substrate coplanar with and orthogonal to said first and second conductors and terminating proximate said gap, said bottomside section of said third conductor extending in spaced parallel relation between said stubs of said first and second conductors; and
a diode pair mixer connected to said first and second conductors and said bottomside section at coplanar connection points on the bottomside of said substrate for heterodyne modulation product signal generation.

* * * * *